United States Patent [19]

McLean et al.

[11] Patent Number: 4,759,112
[45] Date of Patent: Jul. 26, 1988

[54] COMBINED SEQUENCING AND INSERTION MACHINE

[75] Inventors: Jean A. McLean, South Hamilton; Robert J. Duncan, Magnola, both of Mass.

[73] Assignee: Emhart Enterprises Corp., Farmington, Conn.

[21] Appl. No.: 55,472

[22] Filed: May 28, 1987

[51] Int. Cl.[4] .............................................. H05K 3/30
[52] U.S. Cl. .................................... 29/566.3; 29/740; 29/741
[58] Field of Search ............. 29/741, 740, 759, 566.3, 29/566.1, 566.2, 564.6, 564.1, 593

[56] References Cited

U.S. PATENT DOCUMENTS

4,549,087 10/1985 Duncen et al. .................... 29/566.3

Primary Examiner—Carl E. Hall
Attorney, Agent, or Firm—Spencer T. Smith

[57] ABSTRACT

Electronic components are deposited in conveyor buckets in a desired sequence to define repetitive groups of components. These components are delivered to an insertion head for insertion into a circuit board. When a component is not properly inserted, the system stops and a replacement part is delivered by a replacement mechanism to an empty bucket on the conveyor. This empty bucket follows the buckets which held the group of components for the board being loaded.

3 Claims, 6 Drawing Sheets

COMBINED SEQUENCING AND INSERTION MACHINE

SPECIFICATION

This invention relates generally to a combined machine that collects components from a variety of sources, positions the components in sequence on a conveyor, tests the components during transportation on the conveyor to a component placement or insertion head and inserts the components into a printed circuit board.

It has been conventional in the process of automatically assembling axial lead electrical components to printed circuit boards to have a plurality of taped series of identical components aligned on a machine which removes the components from the tape and places them in a predesigned sequence on a conveyor. The conveyor then transports the components through a retaping station so that components are taped in the desired sequence for insertion into the board. Thereafter, the taped roll of sequenced components is placed on an insertion machine which removes the components from the tape, bends the component leads and inserts the leads down through openings in the printed circuit board. A cut-clinch unit located beneath the board cuts off excess lead wire and bends the wire over to physically fasten the component to the board.

It is desirable to verify that components en route to the inserting machine meet specification. Universal Instruments Co. of Binghamton, N.Y., manufactures a sequencing and inserting machine which includes a verifier to determine if the components meet specification. If a component fails to be verified, the machine stops, an operator backs up the conveyor so that the failed component will be positioned upstream of the verifier and then manually replaces the failed part. The machine is restarted and the replacement part is passed through the verifier.

It is an object of the present invention to efficiently replace defective or missing components (or improperly inserted components) without reversing the conveyor.

Other objects and advantages of the present invention will become apparent from the following portion of this specification and from the accompanying drawings which illustrate in accordance with the mandate of the patent statutes, a presently preferred embodiment incorporating the principles of the invention.

Referring to the drawings

FIG. 3 (a-d) forms a flow chart illustrating firmware within the control of FIG. 2.

Figure 1:
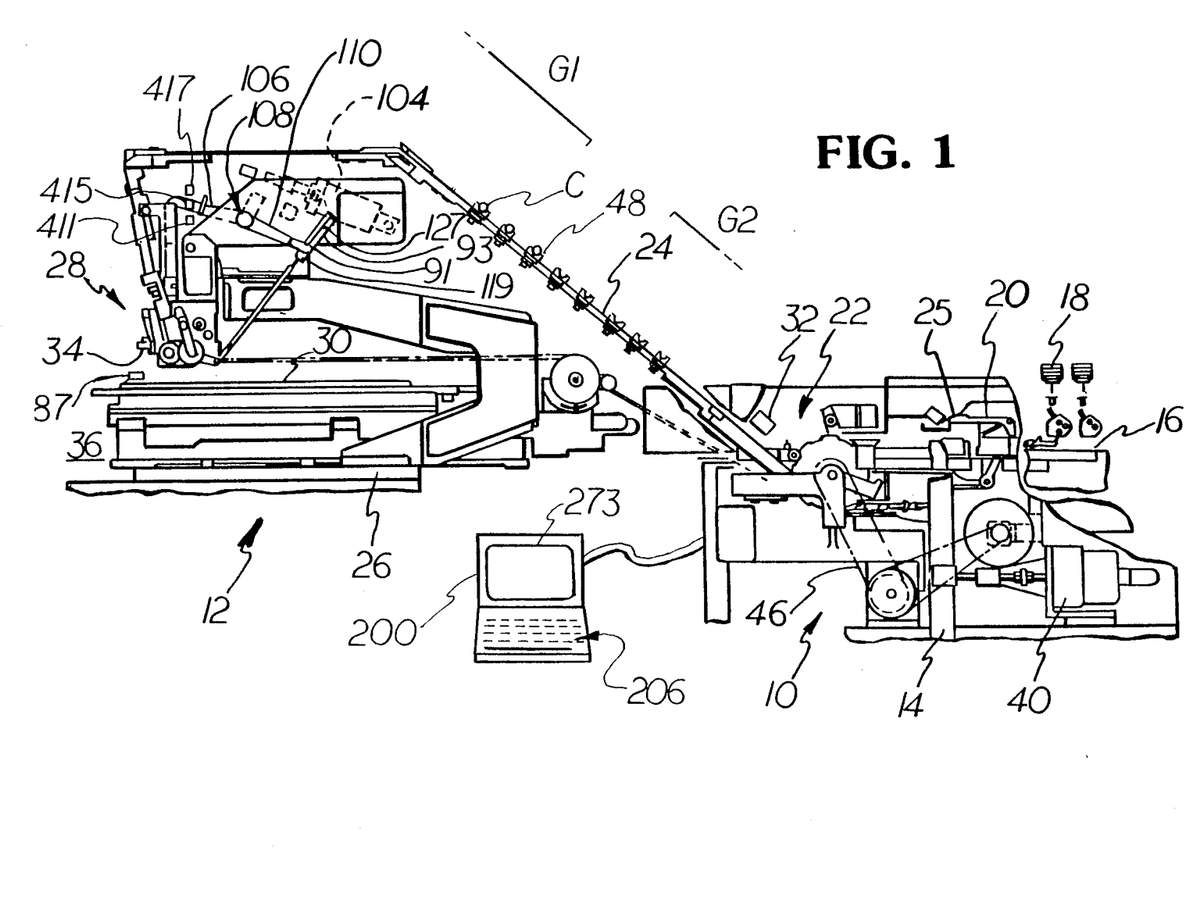
FIG. 1 is an illustration of the combined sequence and inserting machine including a control embodying this invention.

Side by side free standing sequencing 10 and inserting 12 machines are shown in FIG. 1. The sequencing machine is of the type illustrated in U.S. Pat. No. 4,119,206 and includes a base 14 supporting a driven conveyor 16 which receives components (c) from dispensers 18 which remove components from taped reels (not shown) in a predetermined sequence and place the components on clips 48 carried by the conveyor (a section of the conveyor 24 is broken away and enlarged to better show these clips). The components are passed through a verifier 20 to determine the acceptability of the component. Non-specification components are blown off the conveyor by blower 25 leaving a blank space in the sequence. Also, if there is a component missing in the sequence at the verifier, the machine will stop so the operator can inspect for faults in the sequencer.

Thereafter, the components pass through the transfer station 22 onto the transport belt 24 which conveys the components to the insertion machine. The insertion machine is of the type illustrated in U.S. Pat. Nos. 4,080,730 and 4,403,390 and has a base 26 supporting an insertion head 28 which receives the components, forms the leads into a staple shape and inserts the leads into preselected openings of a printed circuit board which is carried on the assembly table 30 of the insertion machine. Located downstream from the transfer station 22 is an inspection station 32 which will tell the machine control the location of missing components in the sequence occurring from components not being properly transported through the transfer station 22. If a component was removed by blower 25, the machine control will tell the inspection station that a blank space is coming and that it should be ignored. If, however, a component does not properly pass through the transfer station, the inspection station will notice the absence of the component and stop the machine so the operator can check for a jammed area, for example, in the transfer station. The machine control will automatically stop the entire combined machine when the missing component sequence reaches the repair station 34 (shown schematically). Details of such a machine are disclosed in co-pending U.S. patent application Ser. No. 871,722, filed June 6, 1986.

Figure 2:
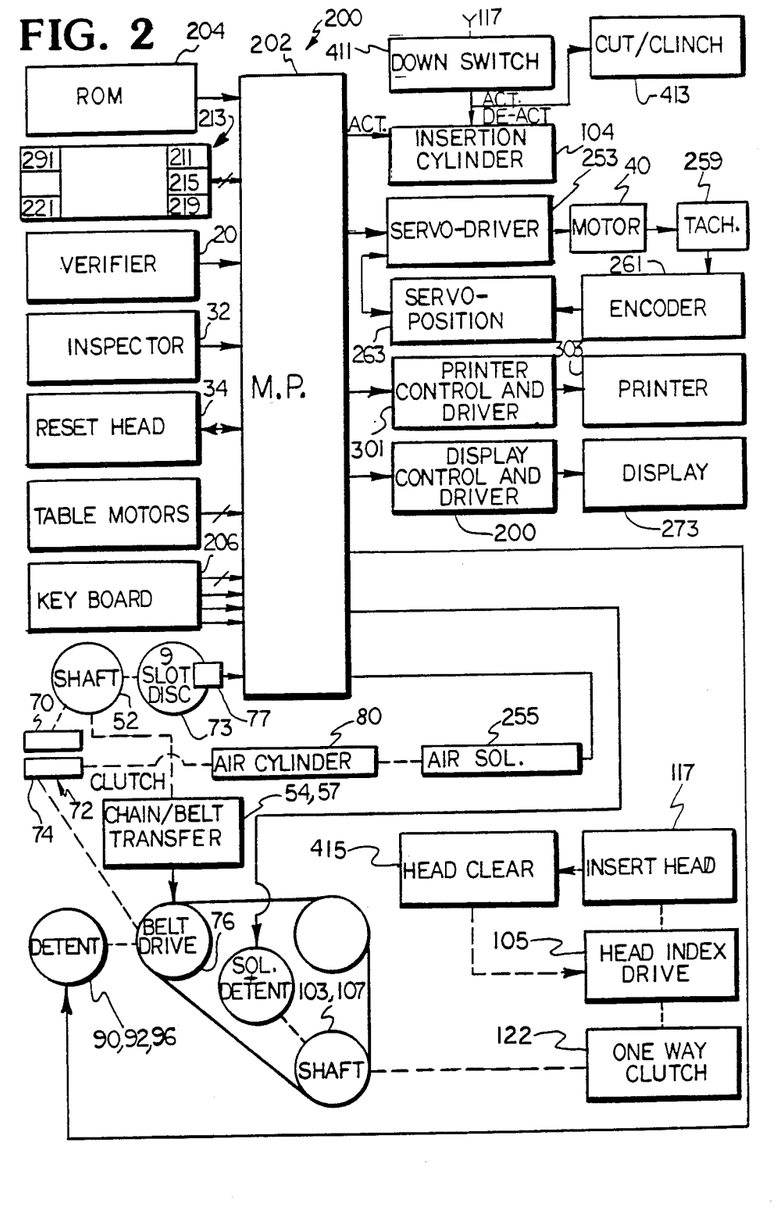
FIG. 2 is a block diagram of electronics within the control of FIG. 1 and other mechanical parts illustrated in FIGS. 1.

The insertion machine has an insertion error detector 287 which determines whether each component has been inserted properly (see for example, U.S. Pat. No. 4,549,087). The output of the detector 287 is supplied to the microprocessor 202 of the electronic control 200 (FIG. 2). As described in more detail below and as shown in FIG. 1, after each group of components, G1, G2, ... is dispensed onto the belt 16, the microprocessor directs the sequencer 18 to leave a plurality, for example; four, of the clips 48 empty. The reason that four empty clips are provided after each group is that in the illustrated embodiment, there are four unit lengths between the repair station and the insertion head so that if the insertion error occurs at the last component of the group, there is still an empty pair of clips 48 at the repair station available to receive the inserted part. Consequently, if a part is inserted improperly, the microprocessor stops the machine when one of the empty pairs of clips following the group appears at the repair station, displays the needed part for the empty clips at the CRT 273 and waits for the operation to manually install and verify the needed part.

Figure 3A:
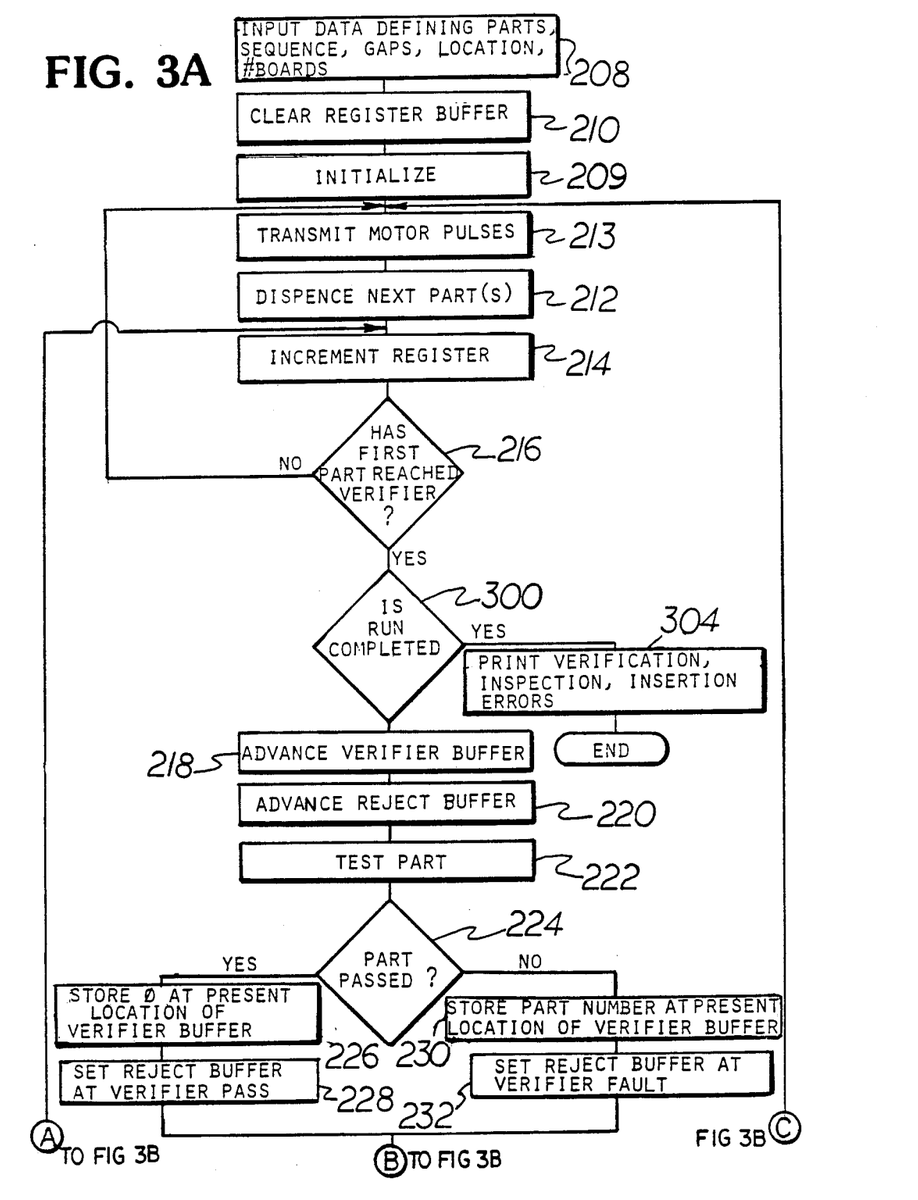
Figure 3B:
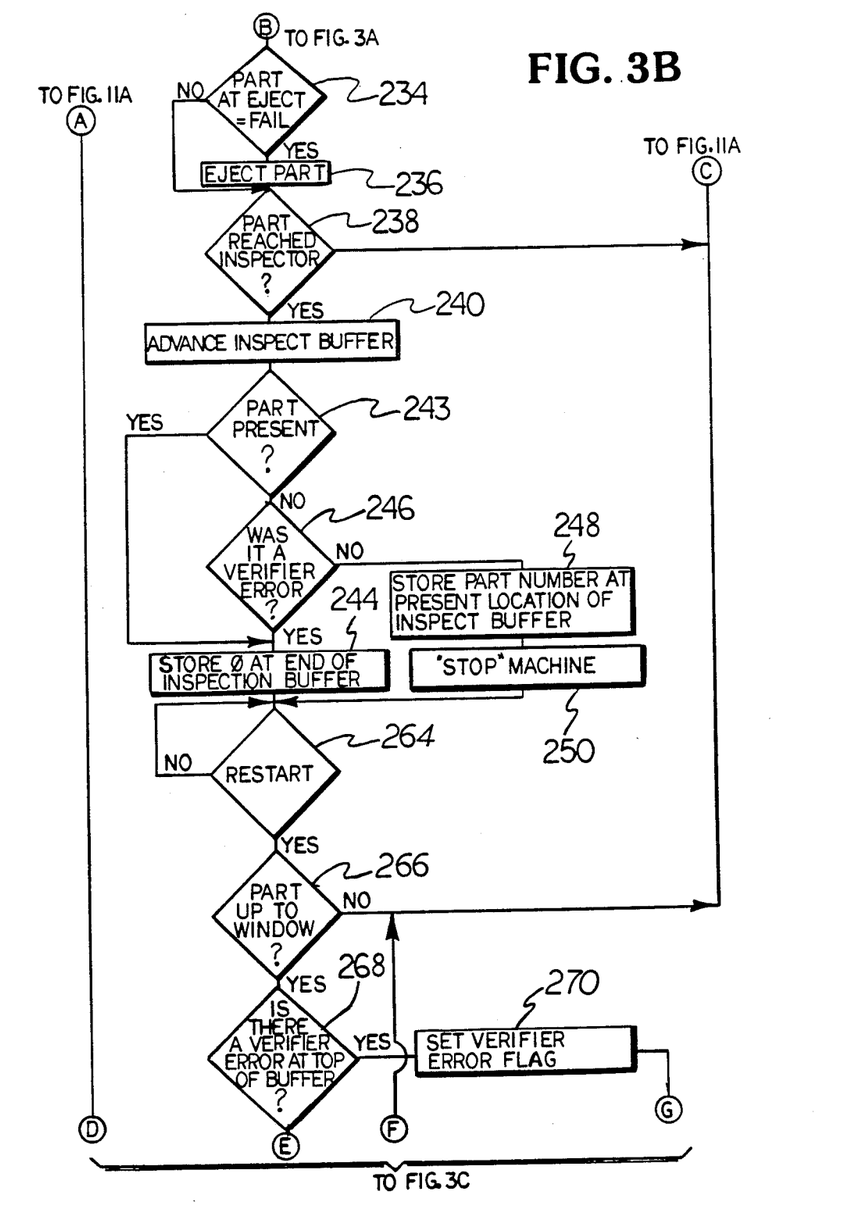
Figure 3C:
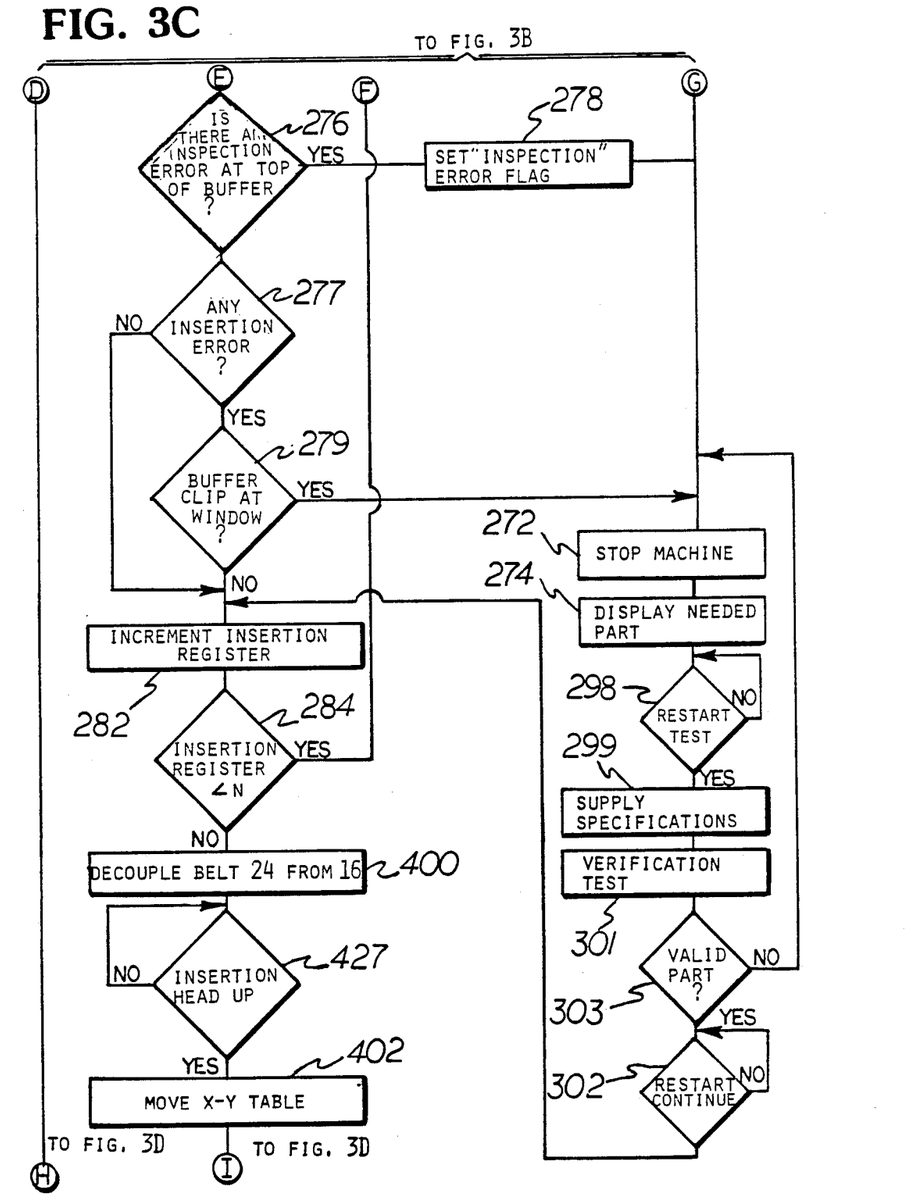
Figure 3D:
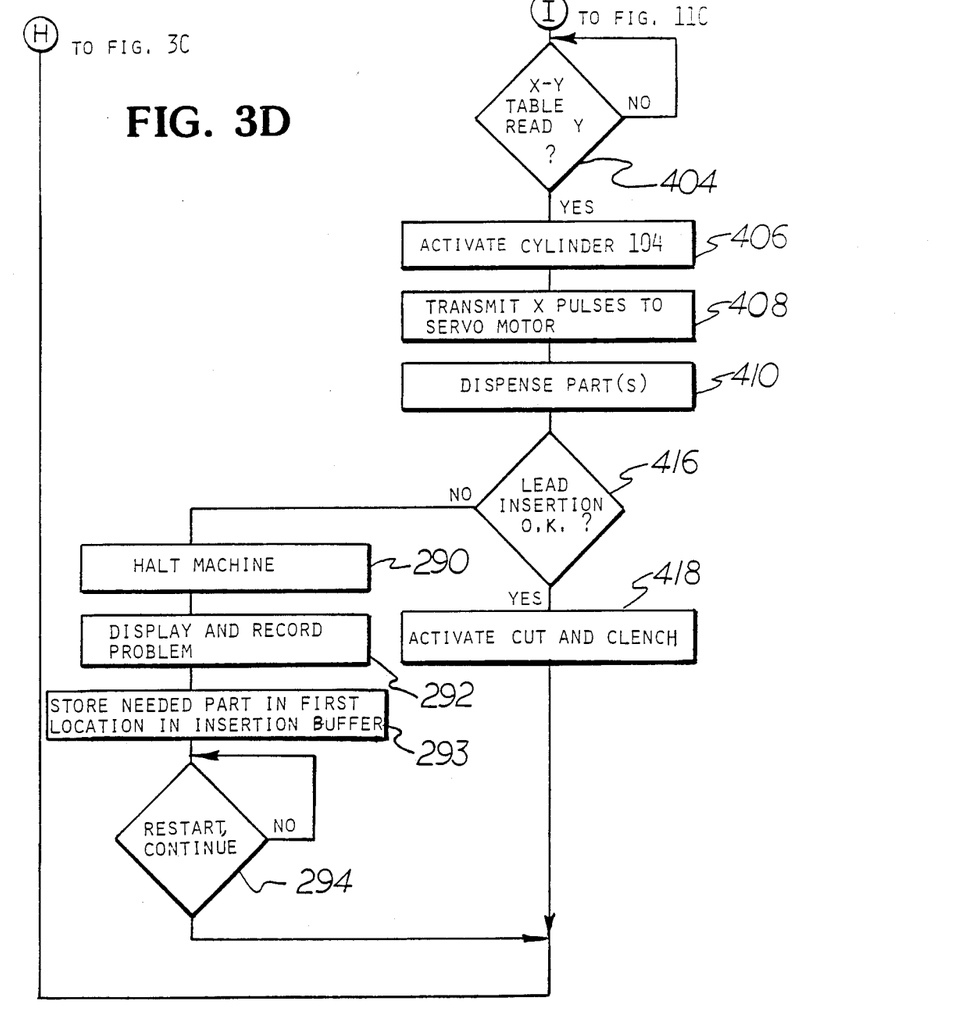

The microprocessor 202 is operated according to firmware programmed into a read-only memory (ROM) 204. The flow chart of FIGS. 3(a-f) illustrates the operation of the microprocessor 202 according to the firmware in the ROM 204. To begin a sequencing and insertion run, an operator initially inputs data through a keyboard 206 on the control 200 defining the parts which are included in each printed circuit board, a sequence in which the parts should be fed to the insertion head, a number of empty pairs of the clips 48 to follow each group of parts associated with each board, the desired location of each part on the printed circuit board, and the total number of boards for the run (step 208). In response, the microprocessor initially resets or clears all of the registers and buffers mentioned below (step 210). Then, the microprocessor initializes the position of the belt 16 (step 209) in which step the microprocessor activates the servomotor 40 until the microprocessor receives a signal from a photodetector 77. The photodetector detects the position of a disc 73 attached to the shaft 52, which disc has a series of circumferentially arranged slots which indicates the position of the shaft 52 and the belt 16.

Then the microprocessor further activates the motor 40 by transmitting an appropriate number of pulses to a servo-drive 253 suitable to drive the belt 16 such that the clips 48 are positioned to receive parts from the dispenser 18 (step 213). Next, one or more parts of the aforesaid sequence for the first board are dispensed from the appropriate dispensers 18 onto the conveyor 16 (step 212). The number of parts dispensed at each incremental position of the belt 16 depends on which of the dispensers 18 are then situated over the clips 48 which are to receive the associated parts. Next, the microprocessor increments a first register 211 contained within a random-access memory (RAM) 213 within the electronic control which register is used to count the number of increments of the belt 16 at any time (step 214). Consequently, the microprocessor knows the location of the first and each part by the counts stored in the register 211. The microprocessor also has been programmed with the distances between the dispensers 18 and the verifier 20. After the first parts have been dispensed as previously stated, and the register 211 incremented for the first time (step 214), the microprocessor then determines whether the first part in the group has reached the verifier 20 (step 216). By way of example, there are several unit distances between the most downstream dispenser 18 and the verifier 20 so that the first part has not yet reached the verifier. Consequently, the microprocessor causes the belt 16 to move one more unit length (step 213) and dispenses the next parts (step 212) and loops through the steps 214, 216, 213 and 212 until the first part reaches the verifier, at which time, the microprocessor notes from the count of the register 211 that the run has not yet been completed (step 220) and advances a verifier buffer 215 located within the RAM 213 (step 218). The verifier buffer is a first-in, first-out type so that the advance of the verifier buffer exposes a first set of stored locations to a set of input ports. Similarly, the microprocessor advances a first-in, first-out reject buffer 219 located in the RAM 213 to expose its first set of storage locations to a first set of input ports (step 220). Next, the microprocessor tests the first part in the manner previously described to determine if the part meets specification (step 222). If the part passes the test as indicated by a step 224, the microprocessor stores a zero in the first set of locations in the verifier buffer 215 (step 226). Also, the microprocessor transmits a "passed test" signal to the first location of the reject buffer 219 (step 228). The reject buffer 219 has a number of sets of storage locations which correspond to the distance between the verifier and the reject blower 25 so that when a rejected part reaches the blower 25, the reject buffer 219 presents the reject information at a set of output ports to activate the rejector. If the part had, in fact, failed the test as indicated by the step 224, the microprocessor stores the part number in the first position of the verifier buffer (step 230), and transmits a "fail test" signal to the reject buffer 219 (step 232).

When each part reaches the rejector 25, the microprocessor examines the corresponding output of the reject buffer 219 (step 234). If the part is a failure, then the microprocessor activates the rejector (step 236), and if not, the microprocessor determines whether the first part has reached the inspector 32 (step 238) based on the count of the register 211 (step 238). If not, the microprocessor moves back to the step 213 in which it dispenses the next part and loops through the steps 213–236 to increment the register and the belt 16, dispense parts and test the part. The micro-processor repeats this loop until the first part reaches the inspector 32 at which time, the micro-processor advances an inspection buffer 221 within the RAM 213 which buffer is a first-in first-out type (step 240). Then, the microprocessor reads the output of the inspector 32 to determine if the part is present (step 242). If so, the microprocessor stores a zero at the first location in the inspection buffer 221 (step 244). If not, the microprocessor reads the output of the verifier buffer which corresponds to the part at the inspector to determine if the part failed the verification test and was rejected (step 246). If such was the reason for the absence of the part at the inspector, the microprocessor stores a zero at the first location in the inspection buffer 221 because this means that there was not a transfer error associated with the missing part. However, if there was not a verification error, but the part was missing at the inspection site, this indicates a transfer error by the transfer mechanism 22 and the microprocessor stores the part number at the present location of the buffer 221 (step 248) and stops the operation of the machine (step 250). The machine is stopped to allow an operator to locate the missing part which may have fallen into the machine; this prevents damage to the machine and/or a chain of transfer errors. The microprocessor stops the machine by sending an appropriate signal to the servo-driver 253 which controls the motor 40. The servo-driver 253 operates in a loop which also includes a tachometer 259, a shaft encoder 261 and a servo-position signaler 263.

The microprocessor maintains the machine in the STOP mode until the operator presses an appropriate key on the keyboard 206 (step 264). At such time, the microprocessor restarts the machine and checks the count in the register 211 to determine if the first part (or any subsequent part) has reached the repair station 34 (step 266). If not, the microprocessor loops back to the step 213 to advance the chain 16 and direct the sequencer to dispense the parts associated with the next position of the chain 16. However, if a part has reached the repair station, the microprocessor reads the corresponding output of the verifier buffer 215, the inspection buffer 221 and an insertion buffer 291 (discussed below) to determine if a new part needs to be inserted into the clips 48 at the repair station (step 268). If the need results from a verification error, the microprocessor sets a "verifier" error flag (step 270), stops the machine (step 272) and displays on a CRT 273 (FIG. 1) the part which is needed for the empty clips 48 (step 274). On the other hand, if there was no verification error detected in the step 268, the microprocessor then reads the output of the inspection buffer 221 to determine if there was a transfer error associated with the clips 48 at the repair station (step 276), and if so, sets an "inspection" error flag (step 278), stops the machine (step 272) and displays the needed part (step 274) to fill the empty clip 48. After the needed part is displayed, the operator has an opportunity to manually obtain the needed part and install it in the window in the repair station 34. Then, the operator may press an appropriate button on the keyboard 206 to restart the machine and begin another verification test conducted at the repair station 34 (step 298). To conduct the test, the microprocessor reads the number of the needed part from the verification buffer 215, inspection buffer 221 or insertion buffer 291 as the case may be (step 299), and supplies the corresponding part specifications to the verifier 20 which is electrically connected to the test contacts in the repair station. Then the verifier performs the actual test(s) (step 301). If the part passes the test (step 303), the operator may press another appropriate button on the keyboard 206 to direct the microprocessor to continue the operation of the machine at the step 282 (step 302). However, if this manually obtained part fails the verification test of the step 301, the microprocessor loops back to the step 272 to give the operator an opportunity to try still another part. After a valid part is installed and tested, the microprocessor proceeds to the step 282.

Alternately, if there were no verification error noted in step 268, no inspection error noted in the step 276, and no insertion error noted in step 277, the microprocessor proceeds directly to the step 282 and increments the insertion register 291 contained within the RAM 213 (step 282). The micro-processor was previously programmed with the number of unit distances between the repair station 34 and the insertion head 28 and until the insertion register reaches a count of "N" (step 284), the first part has not yet reached the insertion head so that the microprocessor loops back to the step 213 to dispense the next parts onto the conveyor 16. The microprocessor then repeats the aforesaid steps N - 1 iterations until the first part reaches the insertion head at which time, the microprocessor decouples the belt 16 from the belt 24 (step 400) by transmitting a deactivation signal to an air solenoid 255 which in turn deactivates the air cylinder 80 and disengages the clutch 72. Next, the microprocessor determines if the insertion head 28 is up by reading a switch 417 (FIG. 1) (step 427) and if so, directs the movement of an X-Y table which supports the printed circuit board to position the holes associated with the first part underneath the insertion head and also sets a depth stop for the insertion head (step 402). After the table has been moved and the depth set as indicated by feedback signals (step 404), the microprocessor activates the air cylinder 104 (step 406) to cause the insertion head to move downwardly and begin to insert the first (or next) part into the proper location within the printed circuit board. Immediately after activating the cylinder 104, the microprocessor transmits the fixed number of pulses to the servo-driver 253 (step 408) to cause the motor 40 to advance the belt 16 one unit length, and such movement begins immediately. The microprocessor then directs the sequencer to dispense the next part(s) (step 410) which dispensing physically occurs before the belt 24 is subsequently indexed as discussed below. Next, the microprocessor executes steps 214, 216, 300, 218-232 to test the next part. Meanwhile, as the insertion head moves downwardly, the belt 24 is stationary and the insertion head penetrates the spaces between the belt 24 and attempts to insert the part in the board. When the head reaches its lowest point, the head physically activates a switch 411 (FIG. 1) which activates the lead sensing device 287 to determine if the leads were properly inserted and deactivates the air cylinder 104. If the leads were properly inserted (step 416), the microprocessor activates a cut and clinch device 411 located beneath the part (step 418) which operates during the time it takes for the insertion head to change directions. Then, the head is withdrawn and after it clears the belt, it physically activates a head clear switch 415 which activates a head index drive to rapidly index the position of the belt 24. The indexing is complete when the head 28 reaches its most upward which fact is sensed by the switch 417. It should be noted that by this time, the belt 16 has been incremented one unit length and the verification test adjacent to the belt 16 has been completed. Consequently, after the belt 24 has been indexed, the next part is transferred across the station 22 and the belt 24 is positioned for the next insertion. If there was a lead insertion error noted in the step 416, the microprocessor halts the machines (step 290), displays and records the problem (step 292) and stores the needed part in the insertion buffer 291 (step 293). Then, the microprocessor waits until an operator presses an appropriate button on the keyboard 206 to restart the machine (step 294) at which time, the microprocessor loops back to the step 214 to increment the resistor 211. During the interim, the operator has an opportunity to remove the part which was inserted improperly. The microprocessor uses the information stored in the step 292 to determine the part number to display on the monitor 273 and the specification to supply to the verifier 20 when the next pair of originally empty clips 48, provided after the present group of parts, reaches the repair station (steps 277, 279, 272, 274, 298, 299, 301, 303 and 302). The aforesaid process for executing a cycle of operation of the insertion head and the belt 24 during the same period that a cycle of operation of the belt 16, the sequencer 18 and the verifier 20 is completed occurs a multiplicity of times until at least the last part in the run has been transferred across the station 22. At which time, the motor 40 and the associated belt 16 and sequencer 18 may be shut off if desired and the insertion head and belt 16 operated alone. However, if desired, the simultaneous operation of cycles of the insertion head 28 and belt 24 with the sequencer 18 and belt 16 may be repeated until the last part of the run has been inserted in the printed circuit board. This latter process is illustrated in the flow chart of FIG. 11. It should be noted that when the aforesaid pair of originally empty clips 48, arrive at the repair station, the new part is installed, and when the new part arrives at the insertion head, it is inserted in the proper location under the direction of the microprocessor.

After the last part of the run has been inserted as noted in a step 300, (FIG. 11(a)), the microprocessor directs a printer control and driver 301, illustrated in FIG. 10 to print all of the verification insertion and inspection errors detected during the run on a printer 303 (step 304). The resultant printed report indicates whether certain types of parts have an inordinately high rate of failing the specifications, in which case the operator may take steps to obtain higher quality parts. Also, the report indicates whether the transfer mechanism 22 is working properly as well as the insertion device 287.

By the foregoing, a control for a combined sequencing and insertion machine has been disclosed. However, numerous substitutions and modifications may be made without deviating from the scope of the invention. Therefore, the invention has been disclosed by illustration and not limitation.

We claim:

1. A sequencing and inserting machine for placing electrical components on a printed circuit board comprising:

conveyor means, including uniformly spaced means for receiving an electrical component, for delivering the received electrical components to an insertion location, component insertion means located at said insertion location for inserting said components into said printed circuit board, sequencer means for dispensing different components into said receiving means in the sequence that they will be inserted into the printed circuit board, replacement means located upstream of said insertion means for dispensing an electrical component onto one of said receiving means located at a selected replacement location, means for detecting when a component has not been properly inserted by said component insertion means, means for stopping said conveyor when said detecting means detects that a component has not been properly inserted, means for defining a plurality of consecutive empty receiving means between the first component of a sequence and the last component of the next downstream sequence, said plurality of empty receiving means being selected so that one of said empty receiving means will be located at said replacement location when said stopping means stops said conveyor means whereby a replacement component is dispensed by said replacement means into the empty receiving means located at said replacement location.

2. A sequencing and inserting machine according to claim 1 wherein said conveyor means includes a first conveyor for receiving components dispensed by said sequencer means and said first conveyor has a plurality of equally spaced component receiving means, a second conveyor having a plurality of equally spaced component receiving means, and means for transferring components from said first conveyor to said second conveyor.

3. A sequencing and inserting machine according to claim 1, further comprising:

means for visually displaying the component involved in the insertion error which must be replaced by said replacement means.

* * * * *